United States Patent
Wang et al.

(10) Patent No.: US 10,935,847 B2
(45) Date of Patent: Mar. 2, 2021

(54) DISPLAY PANEL AND FABRICATION METHOD THEREOF AND DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Xiaoyuan Wang, Beijing (CN); Ni Yang, Beijing (CN); Wu Wang, Beijing (CN); Yan Fang, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 59 days.

(21) Appl. No.: 15/941,883

(22) Filed: Mar. 30, 2018

(65) Prior Publication Data
US 2019/0064560 A1 Feb. 28, 2019

(30) Foreign Application Priority Data

Aug. 29, 2017 (CN) .......................... 201710757452.8

(51) Int. Cl.
*G02F 1/1339* (2006.01)
*H01L 27/12* (2006.01)
(Continued)

(52) U.S. Cl.
CPC .......... *G02F 1/1339* (2013.01); *G02F 1/1333* (2013.01); *H01L 23/29* (2013.01); *H01L 23/3178* (2013.01); *H01L 27/124* (2013.01); *G02F 1/1368* (2013.01); *G02F 1/133514* (2013.01); *G02F 2001/133302* (2013.01); (Continued)

(58) Field of Classification Search
None
See application file for complete search history.

(56) References Cited

U.S. PATENT DOCUMENTS

2008/0049157 A1 2/2008 Kim et al.
2013/0010240 A1* 1/2013 Moriwaki ............. G02F 1/1339
349/106
(Continued)

FOREIGN PATENT DOCUMENTS

CN 202372734 U 8/2012

OTHER PUBLICATIONS

First Office Action dated Sep. 29, 2019 corresponding to Chinese application No. 201710757452.8.

*Primary Examiner* — Nicholas J Tobergte
*Assistant Examiner* — Kien C Ly
(74) *Attorney, Agent, or Firm* — Nath, Goldberg & Meyer; Joshua B. Goldberg

(57) ABSTRACT

The present disclosure provides a display panel and a fabrication method thereof and a display device. The display panel includes a first substrate and a second substrate, which are aligned and assembled to form a cell, and a sealant sandwiched between the first substrate and the second substrate, wherein a hollow structure is arranged in at least one of a first surface layer of the first substrate facing the second substrate and a second surface layer of the second substrate facing the first substrate, and wherein a portion of the sealant is embedded in the hollow structure.

11 Claims, 2 Drawing Sheets

(51) Int. Cl.
*H01L 23/31* (2006.01)
*H01L 23/29* (2006.01)
*G02F 1/1333* (2006.01)
*G02F 1/1368* (2006.01)
*G02F 1/1335* (2006.01)

(52) U.S. Cl.
CPC ............ *G02F 2001/133354* (2013.01); *G02F 2202/16* (2013.01)

(56) References Cited

U.S. PATENT DOCUMENTS

2015/0131041 A1* 5/2015 Moriwaki ............. G02F 1/1337 349/106
2017/0102578 A1* 4/2017 Shin .................. G02F 1/133512

* cited by examiner

DISPLAY PANEL AND FABRICATION METHOD THEREOF AND DISPLAY DEVICE

CROSS-REFERENCE TO RELATED APPLICATION

This application claims priority to Chinese Patent Application No. 201710757452.8, filed on Aug. 29, 2017 in the Chinese Intellectual Property Office, the present disclosure of which is incorporated by reference herein.

TECHNICAL FIELD

The present disclosure relates to the field of display technology, and particularly relates to a display panel and fabrication method thereof and a display device.

BACKGROUND

A thin film transistor liquid crystal display panel (TFT-LCD Panel) is formed by adhering a array substrate 5 and a color filter substrate 6 through cured sealant 3 at a surrounding region thereof, as shown in FIG. 1. In order to ensure the stability and strength of the structure of the liquid crystal display panel, a good adhesion of the sealant with the array substrate and the color filter substrate is required particularly under harsh conditions such as high temperature and high humidity.

SUMMARY

The present disclosure provides a display panel, comprising a first substrate and a second substrate, which are aligned and assembled to form a cell, and a sealant sandwiched between the first substrate and the second substrate, wherein a hollow structure is arranged in at least one of a first surface layer of the first substrate facing the second substrate and a second surface layer of the second substrate facing the first substrate, and wherein a portion of the sealant is embedded in the hollow structure.

According to an embodiment of the present disclosure, the hollow structure includes at least one groove.

According to an embodiment of the present disclosure, the at least one groove is irregularly arranged in an area of the first surface layer of the first substrate corresponding to the sealant.

According to an embodiment of the present disclosure, the at least one groove is irregularly arranged in an area of the second surface layer of the second substrate corresponding to the sealant.

According to an embodiment of the present disclosure, the at least one groove is irregularly arranged in an area of the first surface layer of the first substrate corresponding to the sealant and at least one groove is irregularly arranged in an area of the second surface layer of the second substrate corresponding to the sealant.

According to an embodiment of the present disclosure, an orthographic projection of the groove on the first substrate or the second substrate is of a line shape, a polygon shape or a circular shape.

According to an embodiment of the present disclosure, the hollow structure arranged in the first surface layer has a depth less than or equal to a thickness of the first surface layer.

According to an embodiment of the present disclosure, the hollow structure arranged in the second surface layer has a depth less than or equal to a thickness of the second surface layer.

According to an embodiment of the present disclosure, the hollow structure arranged in the first surface layer has a depth less than or equal to a thickness of the first surface layer; and the hollow structure arranged in the second surface layer has a depth less than or equal to a thickness of the second surface layer.

According to an embodiment of the present disclosure, the first surface layer and the second surface layer are made of indium tin oxide.

According to an embodiment of the present disclosure, the first substrate is a color filter substrate, the second substrate is an array substrate, and an orthographic projection of the sealant on the first substrate is located in a non-display area of the first substrate.

The second substrate further includes a first conductive layer, an insulation layer is arranged between the first conductive layer and the second surface layer, and the second surface layer is electrically connected to the first conductive layer through a via provided in the insulation layer.

The sealant includes a conductive material.

According to an embodiment of the present disclosure, the conductive material is a gold ball.

The present disclosure further provides a display device, which includes a display panel described above.

There is also provided a fabrication method of the above display panel, including following steps:

forming a first surface layer on a first substrate;
forming a second surface layer on a second substrate;
forming a hollow structure in at least one of the first surface layer and the second surface layer;
arranging a sealant on areas of the first surface layer and the second surface layer corresponding to a non-display area of the display panel;
arranging the sealant in the hollow structure; and
aligning and assembling the first substrate and the second substrate to form a cell.

According to an embodiment of the present disclosure, forming the hollow structure includes forming at least one groove in at least one of the first surface layer and the second surface layer using a full-tone mask process or a half-tone mask process.

DETAILED DESCRIPTION

In order to make those skilled in the art better understand the technical solutions of the present disclosure, a display panel, a fabrication method thereof and a display device provided by the present disclosure are further described in detail below with reference to the accompanying drawings and specific description.

Figure 1:
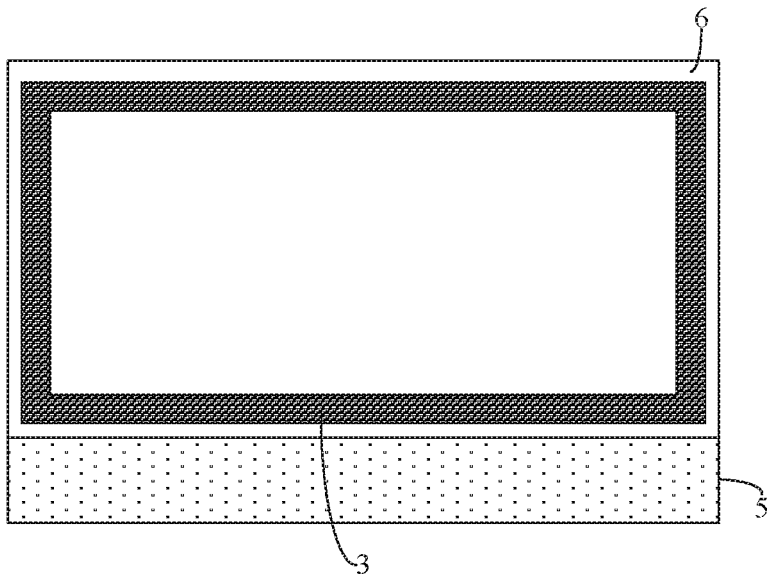
FIG. 1 is a structural schematic diagram of a liquid crystal display panel.
Figure 2:
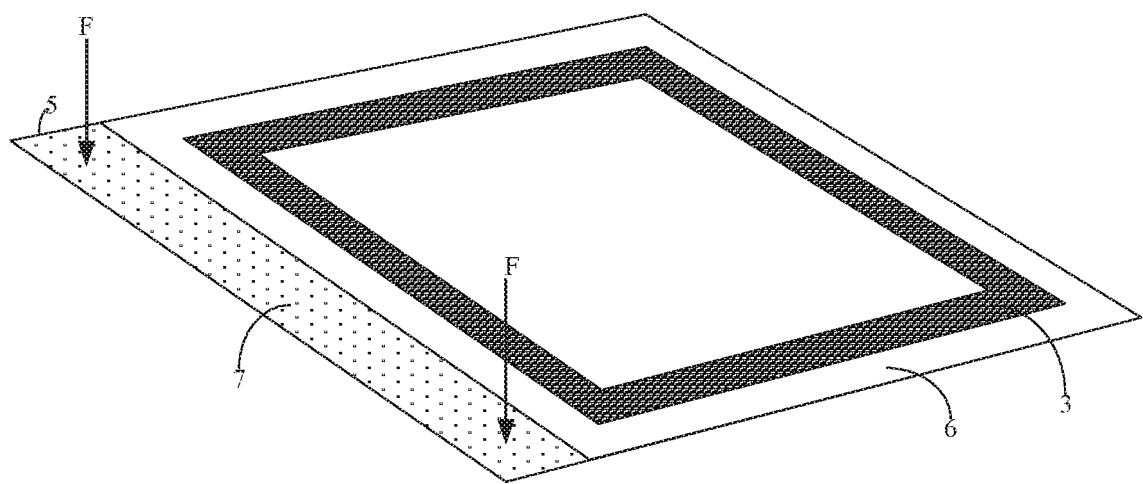
FIG. 2 is a diagram illustrating a peeling test of the liquid crystal display panel of FIG. 1.

At present, the adhesion performance of liquid crystal display panel under normal conditions is tested often through the peeling test by the quality department. As shown in FIG. 2, during the peeling test, a certain pressure F (generally, the pressure F>1.5 kg•f) is applied perpendicularly to an array substrate 5 at two corners of a bonding-wiring area 7 of the array substrate 5, therefore the stability of the structure of the liquid crystal display panel can be determined according to the fact that whether the array substrate 5 and the color filter substrate 6 are peeled off or not and the magnitude of the pressure when they are peeled off. Meanwhile, the liquid crystal display panel to be tested undergoes the peeling test again after being left in a harsh environment such as high temperature, high pressure and high humidity for a long time. In a case where the adhesion between the array substrate and the color filter substrate has not been affected under the normal condition and the harsh condition, the liquid crystal display panel can pass the test.

For a liquid crystal display panel of TN mode (that is, liquid crystal molecules are deflected under the control of a vertical electric field), a pixel electrode layer formed of an indium tin oxide material is located on a surface layer of the array substrate, and a common electrode layer formed of the indium tin oxide material is located on a surface layer of the color filter substrate. In the area where the sealant is located around the display panel, in order to introduce the common electrode signal from the gate conductive layer of the array substrate to the common electrode layer of the color filter substrate, the pixel electrode layer is usually extended to an area of the surface layer of the array substrate corresponding to the sealant, and meanwhile, the common electrode layer is also extended to an area of the surface layer of the color filter substrate corresponding to the sealant. That is, the sealant is directly in contact with the surface layers of the array substrate and the color filter substrate formed of the indium tin oxide material and adhere the two substrates together. Since the properties (e.g. expansion and shrinkage) of the sealant and the indium tin oxide material are greatly different from each other and the surface of the film formed of the indium tin oxide material is relatively smooth, the adhesion between the sealant and the films formed of the indium tin oxide material is relatively poor, such that the array substrate and the color filter substrate would be peeled off from each other easily in the peeling test under the normal condition and the harsh condition.

Therefore, how to make the array substrate and the color filter substrate firmly adhere together through the sealant to ensure the stability of the structure of the display panel has become a problem to be solved urgently.

Figure 3:
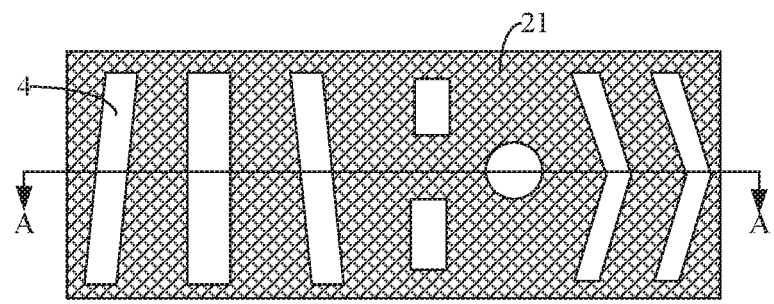
FIG. 3 is a plan view of an area on a surface of a second substrate being in contact with a sealant according to an embodiment of the present disclosure.
Figure 4:
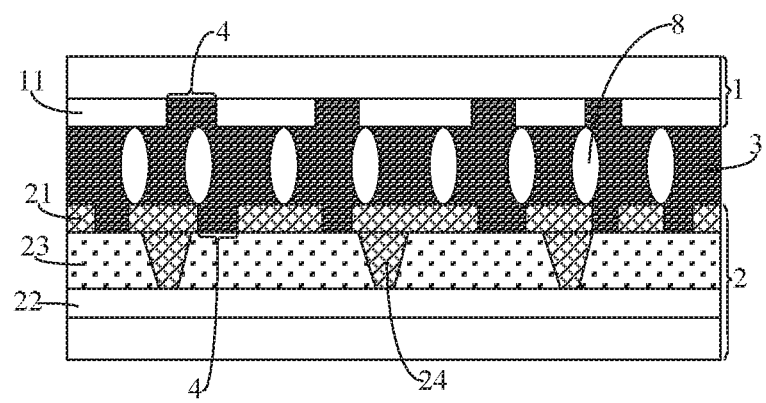
FIG. 4 is a cross-sectional view of the display panel formed by aligning and assembling the second substrate and the first substrate to form a cell, taking along line AA in FIG. 3.

There is provided a display panel according to an embodiment, as shown in FIG. 3 and FIG. 4, the display panel includes a first substrate 1 and a second substrate 2, which are aligned and assembled to form a cell, and a sealant 3 sandwiched between the first substrate 1 and the second substrate 2. The sealant 3 can adhere the first substrate 1 and the second substrate 2 together. Hollow structures 4 are arranged in a first surface layer 11 of the first substrate 1 being in contact with the sealant 3 and a second surface layer 21 of the second substrate 2 being in contact with the sealant 3, respectively, wherein the hollow structures 4 are arranged in an area of the first surface layer 11 corresponding to sealant 3 and an area of the second surface layer 21 corresponding to sealant 3. After the first substrate 1 and the second substrate 2 are aligned and assembled to form a cell, the sealant 3 can be embedded in the hollow structures 4, so that the sealant 3 can adhere the first substrate 1 and the second substrate 2 together more firmly.

With the hollow structures 4 arranged in areas of the first surface layer 11 of the first substrate 1 and the second surface layer 21 of the second substrate 2 corresponding to the sealant 3, the surfaces of areas of the first surface layer 11 and the second surface layer 21 corresponding to the sealant 3 become rough, and the sealant 3 can be embedded in the hollow structures 4. Therefore the first substrate 1 and the second substrate 2 with the sealant 3 may be adhered together more firmly, such that the stability of the structure of the display panel can be improved.

According to an embodiment of the present disclosure, the hollow structure 4 may be arranged in either the first surface layer 1 or the second surface layer 2. For example, the hollow structure 4 may be arranged in the area of the first surface layer 11 of the first substrate 1 corresponding to the sealant 3, which makes the area of the first surface layer 11 corresponding to the sealant 3 become rough. The sealant 3 can be embedded in the hollow structure 4, therefore the first substrate 1 and the sealant 3 may be adhered together more firmly, such that the stability of the structure of the display panel can be improved. Alternatively, the hollow structure 4 may be arranged in the area of the second surface layer 21 of the second substrate 2 corresponding to the sealant 3.

In the embodiment, the hollow structure 4 includes grooves provided in the first surface layer 11 of the first substrate 1 and the second surface layer 21 of the second substrate 2. The grooves can make the areas of the first surface layer 11 of the first substrate 1 and the second surface layer 21 of the second substrate 2 corresponding to the sealant 3 become rough. Therefore the first substrate 1 and the second substrate 2 may be adhered together more firmly through the sealant 3, such that the stability of the structure of the display panel can be improved.

For example, a plurality of grooves may be provided so that they are irregularly distributed in the areas of the first surface layer 11 of the first substrate 1 and the second surface layer 21 of the second substrate 2 corresponding to the sealant 3. With this arrangement, the adhesion of the first substrate 1 and the second substrate 2 with the sealant 3 can be further improved, thereby the stability of the structure of the display panel can be further improved.

In the embodiment, an orthographic projection of the groove on the first substrate or the second substrate may be of a line shape, a polygon shape or a circular shape. The line shape may include a straight line shape and a curved line shape. The groove with an orthographic projection of a straight line shape may be a groove extending in any direction, such as the groove with an orthographic projection of a horizontal line shape, a vertical line shape, a diagonal line shape, or the like. The groove with an orthographic projection of a curved line may be a groove with an orthographic projection of a polygonal line shape or an arc line shape. The groove with an orthographic projection of a polygon shape or circle shape may be a groove which is circular hole, elliptical hole, or a polygonal hole-like groove. The shape of the groove is not limited in the present disclosure, and may be a combination of the above-mentioned shapes of the grooves, so that the roughness of the areas of the first surface layer 11 of the first substrate 1 and the second surface layer 21 of the second substrate 2 corresponding to the sealant 3 can be enhanced. Therefore the adhesion of the first substrate 1 and the second substrate 2 with the sealant 3 may be more firmly.

in the embodiment of the present disclosure, the groove arranged in the first surface layer 11 of the first substrate 1 has a depth less than or equal to a thickness of the first surface layer 11 of the first substrate 1. Additionally or alternatively, the groove arranged in the second surface layer 21 of the second substrate 2 has a depth less than or equal to a thickness of the second surface layer 21 of the second substrate 2. That is, the groove arranged in the first surface layer 11 of the first substrate 1 may penetrate through the entire thickness of the first surface layer 11 of the first substrate 1 or may otherwise be embedded in the first surface layer 11 of the first substrate 1 at a certain thickness of the first surface layer 11. Similarly, the groove arranged in the second surface layer 21 of the second substrate 2 may penetrate through the entire thickness of the second surface layer 21 of the second substrate 2 or may otherwise be embedded in the second surface layer 21 of the second substrate 2 at a certain thickness of the second surface layer 21. Both grooves having the above two depths can make the areas of the first surface layer 11 of the first substrate 1 and the second surface layer 21 of the second substrate 2 corresponding to the sealant 3 become rough, thereby adhesion of the first substrate 1 and the second substrate 2 with the sealant 3 may be more firmly.

In the embodiment, both the first surface layer 11 of the first substrate 1 and the second surface layer 21 of the second substrate 2 are made of an indium tin oxide material. Since the surface of the indium tin oxide film formed of the indium tin oxide material is relatively smooth, and the properties (e.g. expansion and shrinkage) of the sealant 3 and the indium tin oxide film layers are greatly different, which results in that the adhesion between the sealant 3 and the indium tin oxide film layers is relatively poor. The grooves arranged in the first surface layer and the second surface layer can enhance the roughnesses of the first surface layer and the second surface layer, thereby improving the adhesion of the first surface layer and the surface layer with the sealant 3. As a result, the first substrate 1 and the second substrate 2 are not easily peeled off from the sealant 3.

In the embodiment, the first substrate 1 is a color filter substrate, the second substrate 2 is an array substrate, and an orthographic projection of the sealant 3 on the first substrate 1 is located on a non-display area of the first substrate 1. The second substrate 2 further includes a first conductive layer 22 arranged below the second surface layer 21. An insulation layer 23 is arranged between the first conductive layer 22 and the second surface layer 21, and the second surface layer is electrically connected to the first conductive layer 22 through a via 24 provided in the insulation layer 23. The first conductive layer 22 introduces a common voltage signal to the second surface layer through the via 24. The first surface layer 21 may be served as a common electrode. The sealant 3 is conductive, and the sealant 3 may transmit the common voltage signal of the second surface layer to the first surface layer.

The display panel in the embodiment is a liquid crystal display panel of TN (Twisted Nematic) mode (vertical electric field mode). The first conductive layer 22 and a gate conductive layer are made of the same material and arranged in the same layer. The insulation layer 23 includes a gate insulation layer, a passivation layer and an organic planarization layer sequentially arranged on a base of the second substrate 2. Conductive gold ball particles 8 are provided in the sealant 3. The common voltage signal is applied by a driving circuit to the first conductive layer 22, transmitted from the first conductive layer 22 to the second surface layer 21 of the second substrate 2 through the via 24 provided in the insulation layer 23, and then transmitted to the first surface layer (i.e., the common electrode arranged on the color filter substrate) through the gold ball particles 8 in the sealant 3, wherein the first surface layer is in contact with the gold balls 8 in the sealant, such that the common voltage signal may be applied to the common electrode on the color filter substrate.

The display panel provided according to the present disclosure is not limited to the display panel of TN mode, and may also be a liquid crystal display panel of ADS mode (advanced super dimensional switching mode), HADS mode, or IPS mode (in-plane switching electric field mode). The first substrate and the second substrate are provided with a hollow structure, respectively, in areas where the surface layers of the first substrate and the second substrate which are aligned and assembled to form a cell are in contact with the sealant, which makes the areas of the surface layers of the first substrate and the second substrate corresponding to the sealant become rough, thereby the adhesion of the first substrate and the second substrate with the sealant 3 may be more firmly. Therefore the stability of the structure of the display panel can be further improved.

Based on the above structure of the display panel, there is also provided a fabrication method of the display panel according to an embodiment, the method includes following steps:

forming a first surface layer on a first substrate;

forming a second surface layer on a second substrate;

forming a hollow structure in at least one of the first surface layer and the second surface layer;

arranging a sealant on areas of the first surface layer and the second surface layer corresponding to a non-display area of the display panel;

arranging the sealant in the hollow structure; and aligning and assembling the first substrate and the second substrate to form a cell.

According to the embodiment of the present disclosure, forming the hollow structure includes forming at least one groove in at least one of the first surface layer and the second surface layer using a full-tone mask process or a half-tone mask process.

A pattern of the hollow structure is simultaneously formed with other patterns of the surface layers of the first substrate and the second substrate, therefore no additional process steps are added to the fabrication process of the first substrate and the second substrate.

In this embodiment, in a case where the groove has a depth equal to a thickness of the surface layer of the first substrate or the second substrate, a full-tone mask process is applied to form the groove in the surface layer of the first substrate or the second substrate. In a case where the groove has a depth smaller than the thickness of the surface layer of the first substrate or the second substrate, a half-tone mask process is applied to form the groove in the surface layer of the first substrate or the second substrate. The specific fabrication process is a traditional process and is omitted herein.

The beneficial effects of the embodiments are as follows: in the display panel provided in the embodiments, at least one hollow structure is arranged in the areas of the surface layers of the first substrate and the second substrate that are in contact with and corresponds to the sealant, which makes the areas of the surface layers of the first substrate and the second substrate corresponding to the sealant become rough, thereby the adhesion of the first substrate and the second substrate with the sealant 3 may be more firmly. Therefore the stability of the structure of the display panel can be further improved.

According to an embodiment of the present disclosure, there is also provided a display device including a display panel according to the embodiments of the present disclosure.

By adopting the display panel in the embodiment, the stability of the structure of the display device is improved, thereby improving the reliability and the service life of the display device.

The display device provided in the present disclosure may be any product or component having a display function, such as a liquid crystal panel, a liquid crystal television, a display, a mobile phone, a navigator, and the like.

It can be understood that the above embodiments are merely exemplary embodiments used for illustrating the principle of the present disclosure, but the present disclosure is not limited thereto. For those skilled in the art, various modifications and improvements may be made without departing from the spirit and essence of the present disclosure, and these variations and improvements are also considered as the protection scope of the present disclosure.

The invention claimed is:

1. A display panel, comprising a first substrate and a second substrate, which are aligned and assembled to form a cell, and a sealant sandwiched between the first substrate and the second substrate, wherein a hollow structure is arranged in at least one of a first surface layer of the first substrate facing the second substrate and a second surface layer of the second substrate facing the first substrate, and wherein a portion of the sealant is embedded in the hollow structure,
wherein the portion of the sealant is arranged to embed in respective hollow structure of the at least one of the first surface layer and the second surface layer and penetrate the at least one of the first surface layer and the second surface layer to be in direct contact with an interior of at least one of the first substrate and the second substrate,
wherein the first surface layer and the second surface layer are made of indium tin oxide material.

2. The display panel of claim 1, wherein the hollow structure comprises at least one groove.

3. The display panel of claim 2, wherein the at least one groove is irregularly arranged in an area of the first surface layer of the first substrate corresponding to the sealant.

4. The display panel of claim 2, wherein the at least one groove is irregularly arranged in an area of the second surface layer of the second substrate corresponding to the sealant.

5. The display panel of claim 2, wherein the at least one groove is irregularly arranged in an area of the first surface layer of the first substrate corresponding to the sealant and at least one groove is irregularly arranged in an area of the second surface layer of the second substrate corresponding to the sealant.

6. The display panel of claim 3, wherein an orthographic projection of the groove on the first substrate or the second substrate is of a line shape, a polygon shape or a circular shape.

7. The display panel of claim 1, wherein the first substrate is a color filter substrate, the second substrate is an array substrate, and an orthographic projection of the sealant on the first substrate is located in a non-display area of the first substrate;
wherein the second substrate further comprises a first conductive layer, an insulation layer is arranged between the first conductive layer and the second surface layer, and the second surface layer is electrically connected to the first conductive layer through a via provided in the insulation layer; and
wherein the sealant comprises a conductive material.

8. The display panel of claim 7, wherein the conductive material is a gold ball particles.

9. A display device comprising a display panel, which is the display panel of claim 1.

10. A fabrication method of a display panel of claim 1, comprising following steps:
forming the first surface layer on the first substrate;
forming the second surface layer on the second substrate;
forming the hollow structure in the at least one of the first surface layer and the second surface layer, wherein the hollow structure penetrates at least one of the first surface layer and the second surface layer;
arranging the sealant on areas of the first surface layer and the second surface layer corresponding to a non-display area of the display panel;
arranging the sealant in the hollow structure; and
aligning and assembling the first substrate and the second substrate to form a cell.

11. The fabrication method of claim 10, wherein forming the hollow structure comprises forming at least one groove in at least one of the first surface layer and the second surface layer using a full-tone mask process or a half-tone mask process.

* * * * *